United States Patent [19]
Lesch

[11] Patent Number: 5,521,833
[45] Date of Patent: May 28, 1996

[54] METHOD FOR PROGRAMMING PROGRAMMABLE INTEGRATED CIRCUITS

[75] Inventor: Hilmar Lesch, Wolfratshausen, Germany

[73] Assignee: Siemens Aktiengesellschaft, Munich, Germany

[21] Appl. No.: 967,857

[22] Filed: Oct. 28, 1992

[30] Foreign Application Priority Data

Nov. 28, 1991 [DE] Germany .................. 41 39 153.5

[51] Int. Cl.[6] .................................................. H03K 19/173
[52] U.S. Cl. .................................................. 364/489; 364/488
[58] Field of Search .................................. 364/488, 489

[56] References Cited

U.S. PATENT DOCUMENTS

| | | | |
|---|---|---|---|
| 4,481,627 | 11/1984 | Beauchesne et al. | 371/21 |
| 4,930,107 | 5/1990 | Chan et al. | 365/189.08 |
| 5,237,219 | 8/1993 | Cliff | 307/465 |
| 5,257,225 | 10/1993 | Lee | 365/185 |
| 5,321,840 | 6/1994 | Ahlin et al. | 395/700 |
| 5,329,470 | 7/1994 | Sample et al. | 364/578 |
| 5,367,207 | 11/1994 | Goetting et al. | 307/465 |
| 5,371,414 | 12/1994 | Galbraith | 327/525 |

FOREIGN PATENT DOCUMENTS 56-105400 8/1981 Japan .
WO91/07753 5/1991 WIPO .

OTHER PUBLICATIONS

Strassberg, "Feature–packed Universal Programmers Deliver Good Value", Electrical Design News, vol. 33, No. 15, Jul. 21, 1988, pp. 182–193.

*Primary Examiner*—Vincent N. Trans
*Attorney, Agent, or Firm*—Hill, Steadman & Simpson

[57] ABSTRACT

Circuit-associated programming signals and at least one additional, circuit-associated programming routine are generated and are then arranged in a testing device. The function check of printed circuit boards equipped with programmable integrated circuits is provided by measuring sensors which may be, for example, needle adapters. A programming of programmable integrated circuits on equipped PC boards results within the framework of the function test. A considerable cost reduction in the manufacture of PC boards for assemblies with programmable integrated circuits may be achieved. Separate programming at a special programming location may be avoided as well as avoiding a program-associated storing of the programmed integrated circuits.

4 Claims, 1 Drawing Sheet

METHOD FOR PROGRAMMING PROGRAMMABLE INTEGRATED CIRCUITS

BACKGROUND OF THE INVENTION

Programmable integrated circuits are increasingly being arranged on printed circuit boards, for example assemblies for electrotechnical equipment. Programmable integrated circuits include programmable logic array (PLA) circuits, programmable read only memories (EPROM), FLASH-EPROM's, etc. Programmable integrated circuits are soldered into openings of the PC board provided for this purpose or are plugged into plug sockets arranged on the PC board.

During manufacture of PC boards or assemblies having programmable integrated circuits, the circuits provided therefor are first stored. Subsequently, programming of the as yet unprogrammed, integrated circuits occurs with a large variety of programs.

The integrated circuits which are now programmed are again stored which, therefore, requires more spacious storage as well as program-associated storage. Subsequently, the programmed integrated circuits are applied to a respective PC board, either automatically—usually when soldering the integrated circuits—or manually—using plug sockets. Extreme care must, therefore, be exercised in equipping to assure that the programmed integrated circuit having the appropriate program is applied to the respective PC board. In larger electrotechnical systems, such as, for example, in a communication system, equipping mistakes due to a multitude of programs utilized may require considerable outlay to avoid such mistakes.

The functional test of the equipped PC boards or assemblies is usually effected with the assistance of an automatic testing means. Needle adapters are frequently utilized as measuring sensors for the connection of testing equipment to terminal elements of circuit components and, in particular, of the programmed integrated circuits of the PC boards or of the assemblies. The needle adapters are usually pressed against the soldered terminal elements of the integrated circuits or against the plug-in sockets with the assistance of a spring or pneumatic action, and the required electrical connection is, therefore, produced.

SUMMARY OF THE INVENTION

It is, therefore, an object of the present invention to reduce the outlay in the manufacture of PC boards or assemblies having programmable integrated circuits.

A method is, therefore, provided wherein at least one additional circuit-specific program routine and additional means for generating circuit-specific programming signals are provided in the testing equipment in addition to the existing testing programs. The programming of the programmable integrated circuits is implemented by measurement sensors before functional testing of the PC board or assembly.

Circuit-specific programming signals, such as programming voltage signals having a prescribed level, are advantageously realized in the testing equipment in a matching means, and the control of the formed programming voltage signals specifically associated to circuit time and address is effected by the programming routine.

The matching means is normally previously realized for matching the physical properties of the information measured by the measurement sensors, and the information communicated to the measurement sensors, for example setting information, and must merely be supplemented by the means for generating the circuit-associated programming voltage signals. The programming voltage signals may have extremely different levels and are specifically determined by the type of programmable integrated circuit.

The time-suited control of the programming voltage signals, i.e. essentially, the chronological duration per programming cycle, ensues based on the programming routine. Further, the address-specific programming of the programmable integrated circuit is effected by the programming routine. Depending on the type of integrated circuit to be programmed, the addressing or address information is thereby prescribed step-by-step, and the program is deposited or, respectively, stored at the memory area of the programmable integrated circuits prescribed by the address information.

All measures which are required for separate programming at a special programming location and program-associated storing of the programmed integrated circuits may now be eliminated using the method of the present invention. A considerable reduction in cost in the manufacture of PC boards or assemblies having programmable integrated circuits is thereby achieved.

The method is further advantageously utilized when reprogramming integrated circuits that are already programmed and are applied on a PC board or assembly. PC boards or assemblies that are identical in circuit-oriented terms may thereby be simply re-programmed for other applications without any great additional outlay.

The method may also be advantageously utilized when programming programmable integrated circuits with simple programming modes since the programming routine required for the programming may be especially simple, i.e. economically realized in the testing equipment. The contacting of the terminal elements of the programmable integrated circuits is advantageously implemented upon co-utilization of already existing needle adapters controlled by spring action or pneumatically.

Additional features and advantages of the present invention are described, and will be apparent from, the detailed description of the presently preferred embodiments and from the drawings.

BRIEF DESCRIPTION OF THE DRAWINGS

Other objects, features and advantages of the invention, its organization, construction and operation will be best understood from the following detailed description, taken in conjunction with the accompanying drawing, in which.

DETAILED DESCRIPTION OF THE PRESENTLY PREFERRED EMBODIMENTS

Figure 1:
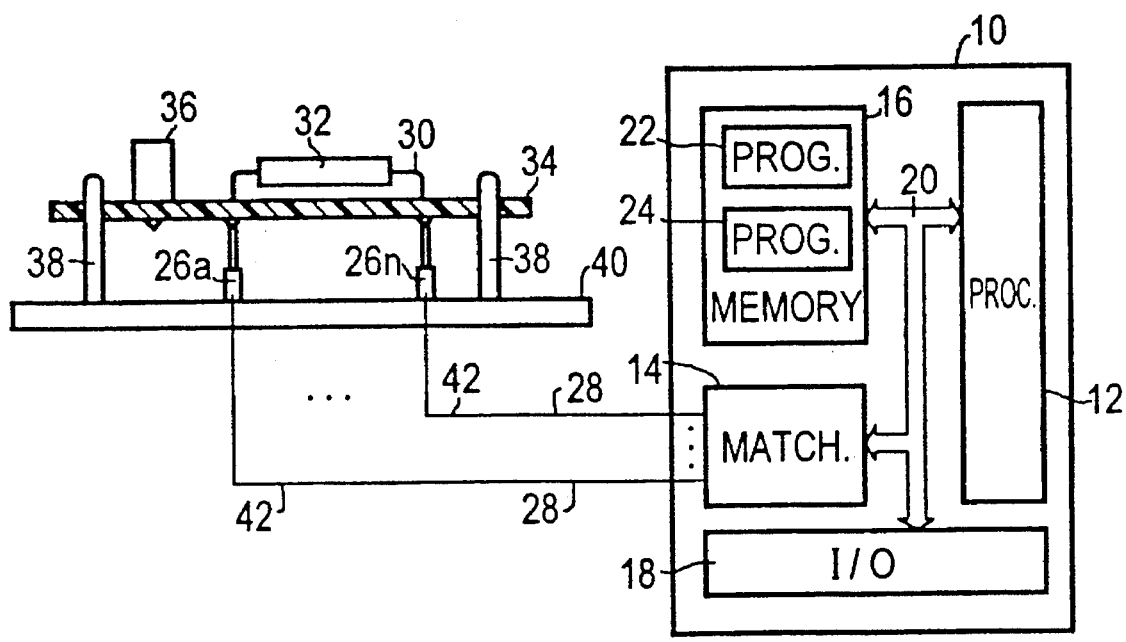
FIG. 1 illustrates a block diagram of testing equipment for implementing the method of the present invention.

FIG. 1 shows testing means 10 formed by a microprocessor 12, matching means 14, a memory 16 and an input/output means 18. Information exchange between these components is effected by a bus system 20 controlled by the microprocessor 12. A program 22 for the function testing and a program 24 for the programming of programmable integrated circuits is stored in the memory means 16.

The test voltages or programming voltages required for the function testing and for the programming are generated in the matching means 14 and are conducted to measuring sensors 26a, . . . ,26n by test connections 28. Furthermore, the measured information communicated by the measuring sensors 26a, . . . ,26n may be converted in the matching means 14 into digital measured information provided for further processing. The information is converted by analog-to-digital converters (not shown). The function testing programs 22 as well as the programming routines 24 are initialized by the input/output means 18, and function test results or measured information are displayed at a display means (not shown).

The measuring sensors 26a. . . ,26n are, for example, contact needles that may be pressed against the measuring point using spring or pneumatic action. The measuring points represent the terminal elements 30 of a programmable integrated circuit 32 soldered in a PC board 34. The programmable integrated circuit 32 may be a programmable logic array (PLA) module, for example. Further electronic components may be present on the PC board 34 as represented by circuit-oriented element 36, for example. Guide elements 38 are arranged in a base plate 40 which engage into the PC board 34 to hold the PC board 34.

Programming of the programmable integrated circuit 34 may be initialized by the testing means 10 before the function test of the PC board 34, i.e. the execution of the prescribed programming routine 24 is initiated. According to the program to be input into the programmable integrated circuit 32, the circuit-associated programming voltage signal 42 sent in the test connections 28 generated in the matching means 14 may be controlled by the programming routine 24 in accordance with the programming times required for the PLA module at the measuring sensors 26a . . . ,26n contacted to the terminal elements 14.

The number and position of the measuring sensors 26a . . . ,26n may be matched to the number and positions of the terminal elements 30 as required for the programming. After the programming of the programmable integrated circuit 32 controlled by the programming routine 24, the function test of both the programmable integrated circuit 32 as well as the further electronic elements 36 arranged on the PC board 34 may be immediately and subsequently implemented.

The measuring sensors 26a, . . . ,26n are thereby driven at the corresponding measurement points of the PC board 34. This, for example, may be effected by displacing the PC board 34 or by the arrangement of the measuring sensors 26a, . . . ,26n.

As a result of the programming and testing using the measuring sensors 26a, . . . ,26n and the testing means 10, programming in a specific programming means as well as the program associated storage may both be foregone. As a result, manufacturing costs of equipping the PC board 34 for other assemblies is considerably reduced.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

I claim:

1. A method for programming programmable integrated circuits arranged on a printed circuit board, terminal elements of said integrated circuits may be contacted with measuring sensors connected to a testing means for function testing of the printed circuit board, the method comprising the steps of:

controlling the programming of said programmable integrated circuits with assistance of an additional circuit-associated programming routine provided in said testing means;

forming circuit-associated programming signals in a matching means provided in said testing means and controlled by said additional circuit programming routine;

transferring said circuit-associated programming signals to the measuring sensors which are at least temporarily contacted to said terminal elements;

testing said printed circuit board with assistance of said testing means after programming of the integrated circuits; and controlling of circuit-associated programming voltage signals in a matching means in said testing means by said at least one programming routine whereby said circuit-associated programming voltage signals are time and address specific to said at least one programmable integrated circuits.

2. The method of claim 1 further comprising the step of:

reprogramming said program integrated circuits with said measuring sensors and said testing means.

3. The method of claim 1 wherein said programming may be provided for integrated circuits with simple programming modes.

4. The method of claim 1 further comprising the step of:

implementing said programming by using needle adapters as said measuring sensors.

* * * * *